United States Patent
Lytle et al.

(10) Patent No.: US 9,017,780 B2
(45) Date of Patent: Apr. 28, 2015

(54) CARBON NANOPIPES AND DUCTWORK WITH NANOMETRIC WALLS AND METHODS OF MAKING THE SAME

(75) Inventors: Justin C Lytle, Tacoma, WA (US); Trevor N. Zimmerman, Pendleton, SC (US); Debra R Rolison, Arlington, VA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 161 days.

(21) Appl. No.: 13/480,907

(22) Filed: May 25, 2012

(65) Prior Publication Data

US 2013/0115840 A1 May 9, 2013

Related U.S. Application Data

(62) Division of application No. 12/188,285, filed on Aug. 8, 2008, now Pat. No. 8,475,698.

(60) Provisional application No. 60/935,539, filed on Aug. 17, 2007.

(51) Int. Cl.
| | | |
|---|---|---|
| B32B 1/08 | (2006.01) | |
| D03D 15/00 | (2006.01) | |
| B82Y 30/00 | (2011.01) | |
| C01B 31/02 | (2006.01) | |
| C04B 35/628 | (2006.01) | |
| C23C 16/01 | (2006.01) | |
| C23C 16/26 | (2006.01) | |
| H01M 4/587 | (2010.01) | |
| B05D 5/12 | (2006.01) | |
| C01B 31/00 | (2006.01) | |
| D04H 13/00 | (2006.01) | |
| B32B 1/02 | (2006.01) | |
| B82Y 40/00 | (2011.01) | |

(52) U.S. Cl.
CPC .............. *D03D 15/00* (2013.01); *Y10T 428/13* (2015.01); *Y10T 428/2918* (2015.01); *B82Y 30/00* (2013.01); *C01B 31/02* (2013.01); *C04B 35/62873* (2013.01); *C04B 35/62897* (2013.01); *C04B 2235/5232* (2013.01); *C04B 2235/5288* (2013.01); *C04B 2235/6028* (2013.01); *C23C 16/01* (2013.01); *C23C 16/26* (2013.01); *H01M 4/587* (2013.01); *B05D 5/12* (2013.01); *B32B 1/08* (2013.01); *B82Y 40/00* (2013.01); *C01B 31/00* (2013.01); *D04H 13/00* (2013.01); *Y10S 427/101* (2013.01)

(58) Field of Classification Search
USPC ...................... 428/34.1, 34.2, 35.7, 35.9, 36.9
See application file for complete search history.

(56) References Cited

U.S. PATENT DOCUMENTS

| | | | | |
|---|---|---|---|---|
| 2003/0111334 A1* | 6/2003 | Dodelet et al. | ................. | 204/164 |
| 2004/0265210 A1* | 12/2004 | Shinohara et al. | .......... | 423/447.3 |
| 2006/0021880 A1* | 2/2006 | Sandoval et al. | ............. | 205/576 |

* cited by examiner

*Primary Examiner* — Marc Patterson
(74) *Attorney, Agent, or Firm* — US Naval Research Laboratory; Stephen T. Hunnius

(57) ABSTRACT

A carbon nanopipe comprising a durable graphitizable carbon wall of tunable thickness of about 10-500 nm formed by exposing a silica fiber network to a carbon precursor vapor and thereby depositing a carbon film onto the silica fiber network at a temperature suitable for complete pyrolysis of the carbon precursor and removing the silica fibers. The atmosphere of the step of depositing is controlled by a two-stage gas manifold wherein stage 1 purges the reaction chamber with pure argon and stage 2 introduces the carbon precursor.

10 Claims, 4 Drawing Sheets

CARBON NANOPIPES AND DUCTWORK WITH NANOMETRIC WALLS AND METHODS OF MAKING THE SAME

This application claims the benefit of priority to U.S. provisional patent application Ser. No. 60/935,539, filed on Aug. 17, 2007, entitled "Carbon nanopipes and ductwork with nanometric walls and methods of making the same," and to U.S. patent application Ser. No. 12/188,285, filed on Aug. 8, 2008, both of which are incorporated by reference in their entirety.

Hollow tubule forms of the carbon allotrope diamond were first reported in 1993; the synthesis was achieved by decomposing $CH_4(g)$, $H_2(g)$, and hydrocarbon oil onto metallic or carbide wire substrates at 850° C., and subsequently etching away the template. The resulting diamond tubules had thick (tens of micrometers) coatings and inner diameters of ~100 µm, but this seminal approach was never fine-tuned for submicrometer morphological control of wall thickness.

A popular method for generating thinner walls in open carbon tubules has been to coat polypyrrole (Ppy) from aqueous solutions onto electrospun poly(ethylene terephthalate) (PET) fibers; the composite fibers are then pyrolyzed at 1000° C. in $N_2(g)$ in order to simultaneously carbonize the Ppy and thermally decompose the polymer fiber core. Tubule architectures templated by electrospun polymer fibers have diameters of several to tens of micrometers and are limited to carbon coating thicknesses that range from hundreds of nanometers to several micrometers. Similar studies have revealed comparable morphological control with electrospun poly(methyl methacrylate) (PMMA) and polyaramid fiber templates as well as the assembly of metallic and metal oxide hollow fibers derived from templating on PET and cotton fiber papers.

Thinner metal oxide coatings deposited onto electrospun polymer fibers can be achieved with atomic layer deposition, as demonstrated with nanoscale films of $Al_2O_3$ templated at the surface of polyvinyl alcohol fibers, but this approach has not been extended to carbons. Anodic aluminum oxide (AAO) membranes have likewise been explored as one-dimensional molds for carbon tubules that are synthesized by depositing hydrocarbon vapors and various polymeric solutions onto the pore walls. The resulting carbon tubules have ultrathin walls (~10 nm) and pore diameters <200 nm that can be adjusted by changing the pore dimensions of the AAO template. Inorganic oxide nanotubes have similarly been synthesized from polyester track-etched membranes, but polymer membranes have not been used as templates for carbon materials.

Membrane-templated tubules are physically detrimental for such applications as three-dimensional (3D) microbatteries because they are densely assembled into lengthy uniaxial bundles without sufficient headspace between the tubules to incorporate additional electrode phases. Nanoarchitectured electrochemical interfaces that are interpenetrated in three-dimensions offer major gains in energy and power density, particularly with respect to the geometric footprint of the battery. Microbatteries comprising three-dimensionally interwoven nanoarchitectures can provide >1 J per square-millimeter of device real estate, an areal capacity that is orders of magnitude larger than the practical capacities of conventional cells. Porous carbons with non-tubular geometries have been developed as electrode nanoarchitectures for 3D microbatteries. Carbon coatings are typically deposited onto spherical colloid templates and inverse opals by pyrolyzing resorcinol-formaldehyde precursors and via hydrocarbon vapor deposition, but the resulting nanoarchitectures have 3D interconnected pore windows that at <100 nm are prone to blockage. New 3D carbons with high electronic conductivity are necessary to advance the development of 3D batteries.

A method is described to fabricate an array of pipes with nanoscopic carbon walls in which the inner and outer carbon surfaces and the inner and outer void spaces are fully interconnected in three dimensions. Ultrathin (10-500 nm) carbon coatings are controllably deposited from hydrocarbon vapors onto commercial glass filter paper; the cylindrical silica cores that comprise the paper are chemically etched to yield an assembly of hollow, thin-walled carbon pipes with continuous electronic pathways and large interfacial areas. The ratio of the inner diameter of the pipe to the wall thickness can be as large as 100. The two-step method disclosed herein uses low-cost and readily available precursors and generates a scalable, three-dimensionally woven mat of porous nanoarchitectures for a range of applications including powerful batteries with minimal geometric footprints, active membranes (e.g., when electrified) for separation science, or innovative heat pipes that wick thermal energy away from microelectronics packaging. The array ("ductwork") of the disclosed invention is also an electrode nanoarchitecture, one that can serve as a stand-alone Li-ion-insertion anode or as a nanoscopic current collector for either solid-state microbatteries in which all electrochemical components are fully interpenetrated in three dimensions or 3D hybrid electrochemical capacitors.

The current application concerns depositing durable carbon coatings of tunable thicknesses (10-500 nm) onto the surfaces of commercial glass filter paper by concomitant pyrolysis at 1000° C. as a dilute stream of hydrocarbon vapor in Ar(g) flows through the porous paper. The silica fibers that comprise the filter paper serve as templating substrates onto which carbon deposits. The silica cores are chemically etched away to yield a 3D mat of electronically networked, hollow carbon tubules with an inner pipe diameter determined by the diameter of the original silica fiber and a wall thickness defined by the depth of the carbon coating.

Figure 1:
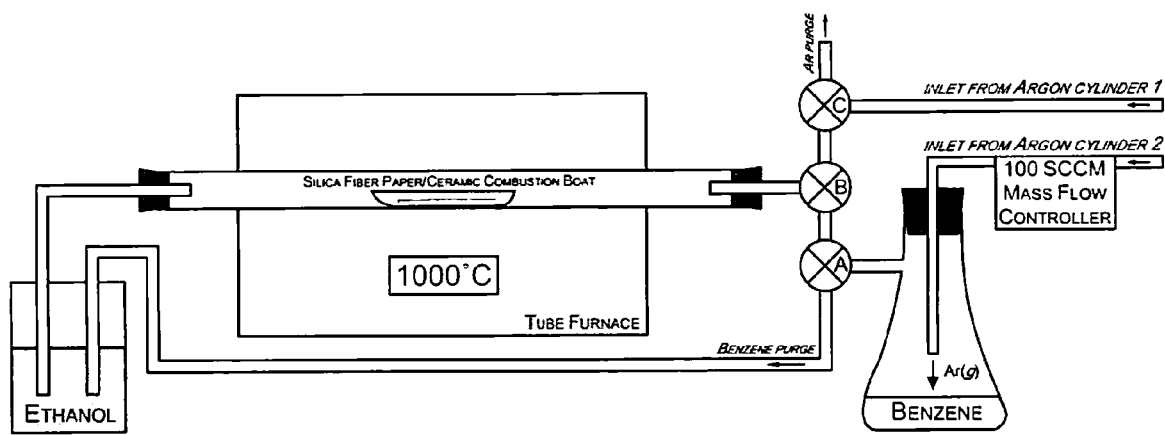
FIG. 1 is a schematic diagram of the two-stage vapor deposition apparatus.

The hollow carbon tubules are fabricated by the following vapor deposition method (refer to FIG. 1 for a diagram of the deposition apparatus). All reactions are heated within a fume hood, and hydrocarbon exhaust is collected by bubbling into an ethanol bath. The alumina reaction tube is calcined at 1000° C. in static air prior to each deposition in order to remove residual carbon coatings that may otherwise participate in the vapor-phase deposition reaction. As-received Tissuquartz filter paper strips (FIG. 2a, Pall Life Sciences, 1 cm×3 cm) are supported on a ceramic combustion boat and heated in an alumina tube that is sealed at both ends with one-hole rubber stoppers in order to introduce and expel gases through glass pipettes. Short segments of PVC tubing (≤3 in)

connect the reaction vessel to a copper-tubing gas manifold that limits the permeation of atmospheric gases into the reaction stream.

The atmosphere of the reaction chamber is controlled by a two-stage gas manifold: stage 1 purges the reaction chamber with pure argon flowing at 100 mL min$^{-1}$ as measured at the exhaust; stage 2 introduces benzene (Aldrich, reagent grade, >99%) vapor as the carbon precursor by flowing argon (100 mL min$^{-1}$ as delivered by a Tylan 100 SCCM mass flow controller and adjusted for the density of Ar(g) relative to $N_2$(g)) over 100 mL of benzene in a 500-mL vacuum filtration flask. The headspace vapor is streamed through the reaction setup and contains ~20 wt. % benzene. Naphthalene (1 g) and acetonitrile (100 mL) were also studied as substitute carbon precursors.

The reaction chamber is purged for 1 hour with pure argon before ramping to 1000° C. at 10° C. min$^{-1}$; the second stage of the manifold is simultaneously purged with precursor vapor diluted in argon. At 1000° C., the manifold valves are manually switched to flow the dilute precursor stream through the heated reaction chamber while diverting argon purge gas into a fume hood. Dwell times range from 3-30 min, at which time the pure argon purge is resumed through the reaction chamber and the chamber cools to room temperature.

This approach is truly unprecedented for the fabrication of hollow carbon tubule materials because this method stringently controls the carbon coating thickness with ~10-nm increments, uses commercially available and inexpensive silica fiber paper templates with sub-micrometer fiber diameters, and results in graphitizable carbons that are advantageous for electrochemical applications.

Figure 2:
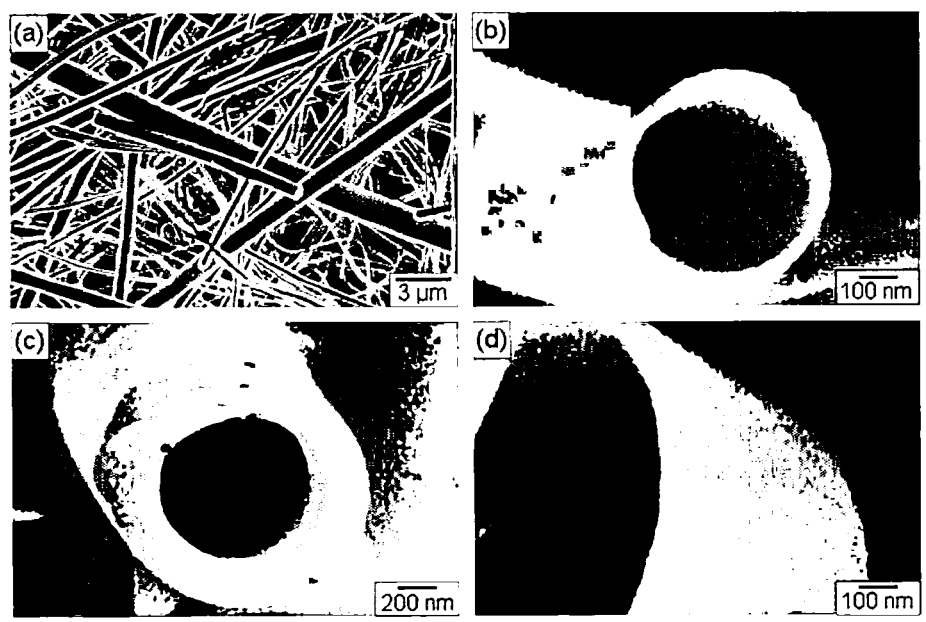
FIG. 2 shows scanning electron micrographs of hollow carbon tubules that are fabricated by exposing a) as-received silica fiber paper to 100 mL $min^{-1}$ of dilute benzene vapor for b) 3 min and c) 20 min; d) thinner coatings are deposited by decreasing the precursor flow rate to 50 mL $min^{-1}$.

Chemical vapor deposition enables us to control the thickness of the deposited carbon coating by adjusting the duration of exposure to the precursor stream. The carbon thickness is tuned in ~10-15 nm min$^{-1}$ increments, permitting rapid fabrications of defined carbon nanoarchitectures. We reproducibly deposit ultrathin (~30 nm) carbon films by exposing a silica fiber network to 3 min of dilute benzene vapor (FIG. 2b); longer dwell times deposit thicker coatings (20 min: ~250 nm; 30 min: ~500 nm; FIG. 2c). In contrast, polymer-derived carbon coatings on electrospun fibers are at best hundreds of nanometers thick; AAO-templated carbon tubules can achieve thicknesses <100 nm, but the resulting tubules are too densely packed for subsequent backfilling with additional components. The thickness of the carbon tubule walls in our products is also tuned by adjusting the flow rate of the carbon precursor vapor stream. Slower precursor flow rates (50 mL min$^{-1}$) yield thinner films (~15-nm thick) than equal durations of benzene deposition at 100 mL min$^{-1}$ precursor flow rates (FIG. 2d).

This ability to define carbon coating thickness with ~10-15 nm resolution enables us to tailor carbon nanoarchitectures for specific applications. Ultrathin carbons have large geometric surface areas that amplify interactions with local chemical environments. Thicker coatings create nanoscopic 3D current collectors with enhanced electronic conductivity that scales as a function of carbon thickness and microstructure and can reach 100 S cm$^{-1}$. Metallic electronic conductivity is proportional to thermal conductivity by the Wiedemann-Franz law. This relationship enables partially graphitized carbon nanopipe ductwork to transfer heat away from microelectronic devices. Nanopipe ductwork is prepared as thin, lightweight (<0.5 mg cm$^{-2}$) thermal ground plates that would efficiently spread heat per unit mass away from intense thermal environments.

Figure 3:
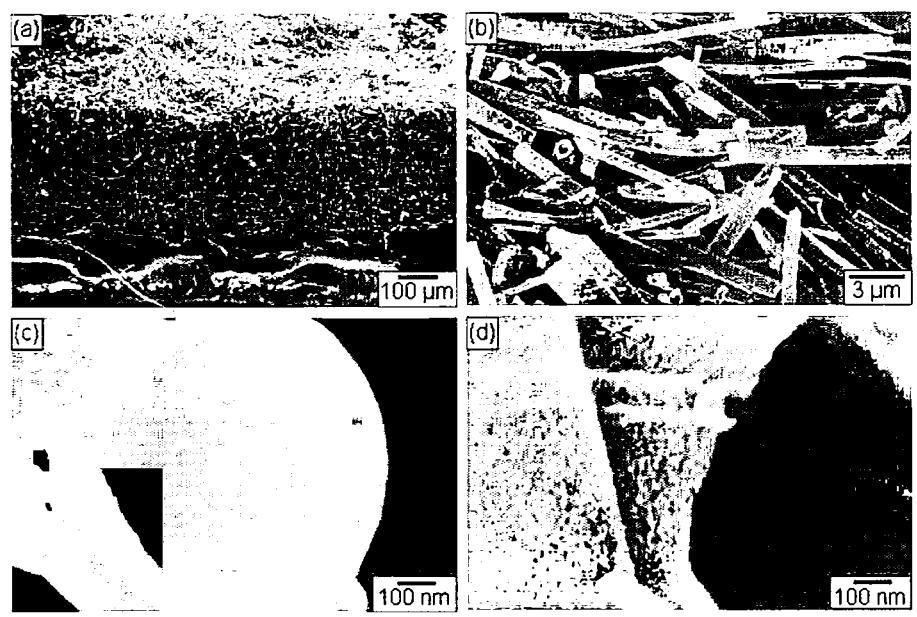
FIG. 3 shows scanning electron micrographs of a) an uncompressed carbon tubule sheet; b) compressed carbon tubules; and carbon tubules that were generated from stacked template sheets: c) top sheet, d) fifth sheet.

The simplicity of our templating approach is a major advantage of this fabrication protocol. Many carbon nanoarchitectures are only made possible by templates that are costly and time-consuming to synthesize and characterize. Electrospun polymer fiber templates, for example, require expensive and dangerous high-voltage power supplies, are hindered by environmental conditions that interfere with the rate of solvent evaporation, and must be characterized by electron microscopy prior to tubule fabrication. Our approach uses commercially available silica filter papers that comprise three-dimensionally interwoven fibers (diameters <1 μm), and can easily be adapted to many other template compositions and geometries. Silica filter paper is inexpensive ($0.11 in$^{-2}$), used as-received, and is sold as easy-to-handle 350-μm-thick sheets that are scalable to fit on miniaturized electronic devices (FIG. 3a). The pore volume within silica filter paper templates is more efficiently utilized by compressing the fiber papers at 4000 p.s.i. for 1 min, reducing the fiber-to-fiber distance in the papers from several micrometers in as-received papers (FIG. 2a) to less than one micrometer (FIG. 3b). The collapsed macropores between the fibers remain large enough to permit non-line-of-sight vapor access throughout stacks of multiple template sheets, resulting in a coating gradient of ~10 nm between the top (FIG. 3c) and bottom sheets (FIG. 3d), which is a variance that is amenable for mass production.

In one manifestation of a three-dimensional (3-D) microbattery, the carbon ductwork serves as a porous electrode scaffold. These conductive tubule arrays, which contain outer and inner free volume with a characteristic length of 10$^2$ nm, can then be sequentially modified to create ultrathin polymer electrolyte/separator films at the inner and outer surfaces of the carbon pipes, and finally infiltrated with nanoscale counter electrode coatings or deposits. Carbon microtubules combine nanometer-scale ion-diffusion pathlengths and high-aspect-ratio electrifiable interfaces with the inherently high electronic conductivity of carbon and an ability to uptake large quantities of Li ion.

Figure 4:
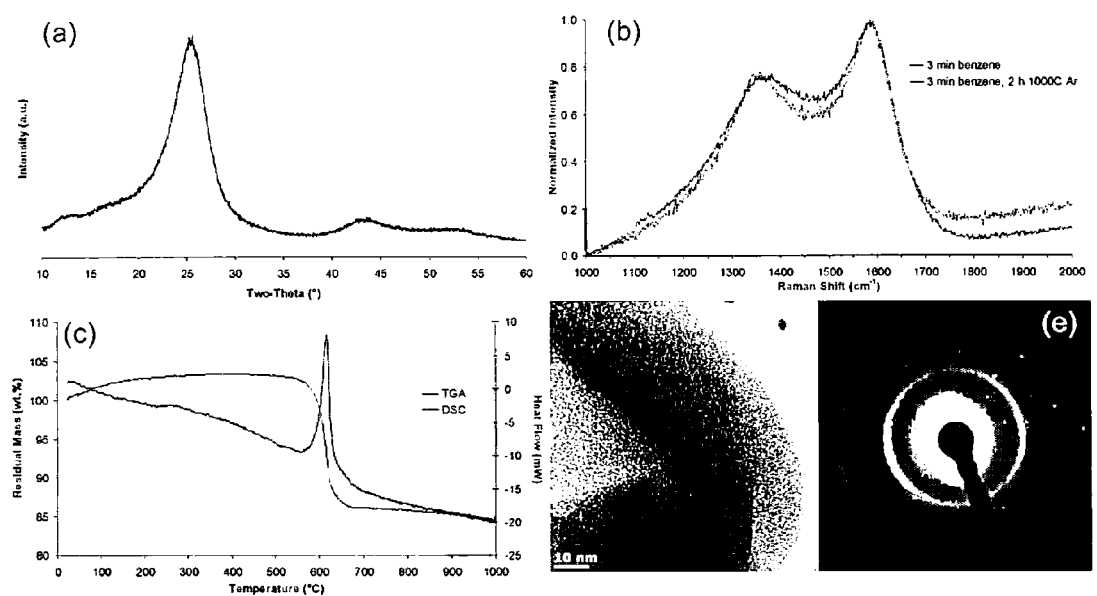
FIG. 4 shows characterizations of carbon tubules: a) X-ray diffraction; b) Raman spectroscopy, c) simultaneous thermal gravimetric analysis/differential scanning calorimetry, d) transmission electron microscopy, and e) electron diffraction.

Another advantage of this approach is the ability to selectively graphitize the deposited carbon microstructure. Graphite, with its unique combination of metallic electronic conductivity and large reversible Li-ion uptake, is advantageous for electrochemical applications, but many carbon nanoarchitectures are non-graphitizable because they are synthesized from non-aromatic hydrocarbon precursors. Our method is compatible with a variety of volatile aromatic precursors that deposit as soft (graphitizable) carbons, as determined from crystalline reflections in X-ray diffraction (XRD) patterns (FIG. 4a), the relative intensity of the G-band absorption (1600 cm$^{-1}$) in the Raman spectra (FIG. 4b), combustion temperatures >600° C. observed by simultaneous thermal gravimetric analysis (TGA) and differential scanning calorimetry (DSC) (FIG. 4c), and transmission electron microscopy (FIG. 4d,e). The degree of structural order in the carbon tubules can be tuned to suit electronic and electrochemical applications: increased graphitic character will be achieved at temperatures >2000° C., whereas disordered carbons are produced by isothermally annealing the deposited carbon in pure argon at 1000° C. for 2 hours.

Metal-catalyzed carbon tubules are the closest approximation to the morphological dimensions and fabrication simplicity of our vapor-deposited materials. Metal chalcogenide particles are reduced by activated carbon feedstock in a vertical induction furnace, nucleating 3-D mats of hollow fibers with 10-20 nm walls. Metal catalyzed-tubules have not been scaled to thicker carbon coatings with greater electronic conductivity, and their highly graphitized microstructure would impede ion diffusion because the highly ordered graphitic microstructure lays parallel to the fiber axis. Carbon tubules that are templated by electrospun polymer fibers have thicker coatings that are not tunable below 100 nm and wider tube diameters. Templating with AAO membranes yields thinner, but dense uniaxial bundles of carbon tubules without headspace for additional composite phases.

The above description is that of a preferred embodiment of the invention. Various modifications and variations are possible in light of the above teachings. It is therefore to be understood that, within the scope of the appended claims, the invention may be practiced otherwise than as specifically described. Any reference to claim elements in the singular, e.g., using the articles "a," "an," "the," or "said" is not construed as limiting the element to the singular.

We claim:

1. An array of carbon nanopipes comprising:
   a carbon nanopipe comprising a durable graphitizable carbon wall of thickness of about 10-500 nm formed by exposing a silica fiber network to a carbon precursor vapor and thereby depositing a carbon film onto the silica fiber network at a temperature suitable for complete pyrolysis of the carbon precursor and removing the silica fibers;
   further including an array or aperiodic ensemble of multiple said carbon nanopipes formed by deposition onto the fiber network;
   wherein the silica fibers are three-dimensionally interwoven fibers having diameters of about <1 μm;
   wherein the array of multiple carbon nanopipes comprises said carbon nanopipes that are three-dimensionally interwoven;
   wherein the carbon precursor is selected from the group consisting of benzene, naphthalene, and acetonitrile; and
   wherein said carbon nanopipes have an outer diameter >100 nm.

2. The carbon nanopipe of claim 1 wherein the atmosphere of the step of depositing is controlled by a two-stage gas manifold wherein stage 1 purges the reaction chamber with pure argon flowing at 100 mL min$^{-1}$ as measured at the exhaust and stage 2 introduces the carbon precursor.

3. The carbon nanopipes of claim 1 wherein the carbon nanopipe has an inner pipe diameter that can be determined by the diameter of the silica fiber and a wall thickness defined by the depth of the carbon coating and wherein the carbon precursor is a vapor in Ar(g) as it flows over the silica fibers.

4. The array of carbon nanopipes of claim 1 wherein the carbon nanopipes have large geometric surface areas that amplify interactions with local chemical environments.

5. The array of nanopipes of claim 4 wherein the carbon nanopipes create nanoscopic three dimensional current collectors with enhanced electronic conductivity that scales as a function of carbon thickness and microstructure and can reach 100 S cm$^{-1}$.

6. The array of carbon nanopipes of claim 5 wherein the array is prepared as thin and lightweight plates and having about <0.5 mg cm$^{-2}$ that would efficiently spread heat per unit mass away from intense thermal environments.

7. The array of carbon nanopipes of claim 6 wherein the carbon precursor contains about 20 wt % benzene and the dwell time is about 3-30 mins.

8. The array of carbon nanopipes of claim 3 wherein the reaction chamber is purged for about 1 hour with pure argon before ramping to about 1000° C. at about 10° C. min$^{-1}$; and purging the second stage of the manifold simultaneously with precursor vapor diluted in argon.

9. The array of carbon nanopipes of claim 8 wherein the dilute precursor stream is flowed through the heated reaction chamber at about 1000° C. while diverting argon purge gas wherein dwell times range from about 3-30 min; wherein the reaction chamber is purged with pure argon; and wherein the reaction chamber is cooled to about room temperature.

10. The array of carbon nanopipes of claim 8 wherein a tunable thickness of about 10 nm is achieved and wherein multiple tunable thicknesses of about 10 nm can be achieved.

* * * * *